US008835748B2

(12) United States Patent
Frolov et al.

(10) Patent No.: US 8,835,748 B2
(45) Date of Patent: Sep. 16, 2014

(54) MULTI-JUNCTION PV MODULE

(75) Inventors: Sergey Frolov, Murray Hill, NJ (US); Allan James Bruce, Scotch Plains, NJ (US); Michael Cyrus, Summit, NJ (US)

(73) Assignee: Sunlight Photonics Inc., Edison, NJ (US)

( * ) Notice: Subject to any disclaimer, the term of this patent is extended or adjusted under 35 U.S.C. 154(b) by 0 days.

(21) Appl. No.: 12/349,396

(22) Filed: Jan. 6, 2009

(65) Prior Publication Data
US 2010/0170556 A1 Jul. 8, 2010

(51) Int. Cl.
- *H01L 31/042* (2014.01)
- *H01L 31/048* (2014.01)
- *H01L 25/04* (2014.01)
- *H01L 27/142* (2014.01)

(52) U.S. Cl.
CPC .......... *H01L 31/042* (2013.01); *H01L 31/0485* (2013.01); *H01L 25/045* (2013.01); *Y02E 10/50* (2013.01); *H01L 27/1423* (2013.01)
USPC ........... 136/249; 136/244; 136/260; 136/262; 136/264; 136/265

(58) Field of Classification Search
USPC .................. 136/249, 244, 260, 262, 264, 265
See application file for complete search history.

(56) References Cited

U.S. PATENT DOCUMENTS

| | | | |
|---|---|---|---|
| 2,949,498 A | 8/1960 | Jackson | |
| 3,978,510 A | 8/1976 | Kasper et al. | |
| 4,094,704 A | 6/1978 | Milnes | |
| 4,295,002 A * | 10/1981 | Chappell et al. | 136/244 |
| 4,335,266 A | 6/1982 | Mickelsen et al. | |
| 4,338,480 A | 7/1982 | Antypas et al. | |
| 4,461,922 A | 7/1984 | Gay et al. | |
| 4,477,721 A * | 10/1984 | Chappell et al. | 257/82 |
| 4,686,323 A | 8/1987 | Biter et al. | |
| 4,784,701 A * | 11/1988 | Sakai et al. | 136/249 |
| 4,798,660 A | 1/1989 | Ermer et al. | |
| 5,223,043 A | 6/1993 | Olson et al. | |
| 5,282,993 A | 2/1994 | Karg | |
| 5,437,735 A * | 8/1995 | Younan et al. | 136/251 |
| 5,441,897 A | 8/1995 | Noufi et al. | |
| 5,445,847 A | 8/1995 | Wada et al. | |
| 5,482,569 A * | 1/1996 | Ihara et al. | 136/251 |
| 5,567,469 A | 10/1996 | Wada et al. | |
| 5,626,688 A * | 5/1997 | Probst et al. | 136/265 |
| 5,985,691 A | 11/1999 | Basol | |

(Continued)

FOREIGN PATENT DOCUMENTS

| | | |
|---|---|---|
| EP | 1962331 | 8/2008 |
| GB | 2128017 | 4/1984 |

(Continued)

OTHER PUBLICATIONS

European Search Report dated Jan. 10, 2013 in corresponding EP application No. 09838022.3, 7 pages.

*Primary Examiner* — Golam Mowla
(74) *Attorney, Agent, or Firm* — Stuart H. Mayer; Mayer & Williams PC

(57) ABSTRACT

A photovoltaic device is provided which includes a plurality of junction layers. Each junction layer includes a plurality of photovoltaic cells electrically connected to one another. At least one of the junction layers is at least in part optically transmissive. The junction layers are arranged in a stack on top of each other.

16 Claims, 9 Drawing Sheets

(56) References Cited

U.S. PATENT DOCUMENTS

| | | |
|---|---|---|
| 6,107,562 A | 8/2000 | Hashimoto et al. |
| 6,258,620 B1 | 7/2001 | Morel et al. |
| 6,274,804 B1 * | 8/2001 | Psyk et al. ................ 136/249 |
| 6,340,789 B1 | 1/2002 | Petritsch et al. |
| 6,350,946 B1 * | 2/2002 | Miyake et al. ............. 136/252 |
| 6,515,217 B1 | 2/2003 | Aylaian |
| 6,534,704 B2 | 3/2003 | Hashimoto et al. |
| 6,559,372 B2 | 5/2003 | Stanbery |
| 6,928,775 B2 * | 8/2005 | Banister ..................... 52/173.3 |
| 6,974,976 B2 | 12/2005 | Hollars |
| 7,537,955 B2 | 5/2009 | Basol |
| 2002/0043279 A1 | 4/2002 | Karg |
| 2003/0013008 A1 * | 1/2003 | Ono ............................ 429/111 |
| 2003/0234038 A1 | 12/2003 | Kurokami et al. |
| 2004/0045598 A1 | 3/2004 | Narayanan et al. |
| 2005/0056312 A1 | 3/2005 | Young et al. |
| 2005/0236032 A1 | 10/2005 | Aoki |
| 2005/0266600 A1 | 12/2005 | Basol |
| 2005/0271827 A1 | 12/2005 | Krunks et al. |
| 2008/0057203 A1 | 3/2008 | Robinson et al. |
| 2008/0057616 A1 | 3/2008 | Robinson et al. |
| 2008/0121277 A1 | 5/2008 | Robinson et al. |
| 2008/0124831 A1 | 5/2008 | Robinson et al. |
| 2008/0175982 A1 | 7/2008 | Robinson et al. |
| 2008/0280030 A1 | 11/2008 | Van Duren et al. |
| 2009/0107550 A1 | 4/2009 | Van Durgen et al. |
| 2009/0162969 A1 | 6/2009 | Basol |
| 2009/0229666 A1 | 9/2009 | Corneille et al. |
| 2010/0029036 A1 | 2/2010 | Robinson et al. |

FOREIGN PATENT DOCUMENTS

| | | |
|---|---|---|
| JP | 57153478 | 9/1982 |
| JP | 59161081 | 11/1984 |
| JP | 11-273753 A | 10/1999 |
| JP | 2000-091613 A | 3/2000 |
| JP | 2001308354 | 11/2001 |
| JP | 2003-282916 A | 10/2003 |
| JP | 2004103834 | 4/2004 |
| JP | 2004-296615 | 10/2004 |
| JP | 2006024574 | 1/2006 |
| JP | 2006-245507 | 9/2006 |
| KR | 10-2008-0003624 | 1/2008 |
| WO | 2006/074561 | 7/2006 |

* cited by examiner

MULTI-JUNCTION PV MODULE

BACKGROUND

1. Field

The present invention relates generally to a method of manufacturing thin-film photovoltaic devices, and particularly to a method for the manufacturing of high-efficiency thin-film photovoltaic devices.

2. Related Art

Photovoltaic devices represent one of the major sources of environmentally clean and renewable energy. They are frequently used to convert optical energy into electrical energy. Typically, a photovoltaic device is made of one semiconducting material with p-doped and n-doped regions. The conversion efficiency of solar power into electricity of this device is limited to a maximum of about 37%, since photon energy in excess of the semiconductor's bandgap is wasted as heat. A photovoltaic device with multiple semiconductor layers of different bandgaps is more efficient: an optimized two-bandgap photovoltaic device has the maximum solar conversion efficiency of 50%, whereas a three-bandgap photovoltaic device has the maximum solar conversion efficiency of 56%. Realized efficiencies are typically less than theoretical values in all cases.

Multi-layered or multi-junction devices are currently manufactured as monolithic wafers, where each semiconductor layer is crystal-grown on top of the previous one. As a result, the semiconductor junction layers are electrically connected in series and have to be current-matched, in order to obtain maximum conversion efficiency. This current-matching procedure complicates the design and decreases the efficiency of the device. The latter becomes particularly evident when considering the effect of spectral filtering on the device efficiency. If a part of the solar spectrum is absorbed or scattered, e.g. by water vapors, the resulting disproportional decrease of photocurrent in one of junctions will limit the current through the whole device and thus decrease its conversion efficiency.

SUMMARY

In accordance with the present invention, a photovoltaic device is provided which includes a plurality of junction layers. Each junction layer includes a plurality of photovoltaic cells electrically connected to one another. At least one of the junction layers is at least in part optically transmissive. The junction layers are arranged in a stack on top of each other.

In accordance with one aspect of the invention, each of the junction layers comprises at least one pair of electrical terminals for producing photogenerated current.

In accordance with another aspect of the invention, the junction layers are manufactured separately on separate substrates.

In accordance with another aspect of the invention, the junction layers are laminated to each other.

In accordance with another aspect of the invention, the junction layers are produced on a common substrate.

In accordance with another aspect of the invention, the junction layers are electrically insulated from each other.

In accordance with another aspect of the invention, the plurality of junction layers comprises at least first and second junction layers. The first layer is configured to absorb a first portion of incident light energy and transmit a second portion of the incident light energy to the second junction layer and the second junction layer is configured to absorb at least a portion of the second incident light energy.

In accordance with another aspect of the invention, the first junction layer comprises photovoltaic cells with a characteristic bandgap that is larger than that of cells in the second junction layer.

In accordance with another aspect of the invention, a number of the photovoltaic cells in at least two of the junction layers are chosen so that their respective output voltages are about equal.

In accordance with another aspect of the invention, a number of the photovoltaic cells in at least two of the junction layers are chosen so that their respective output currents are about equal.

In accordance with another aspect of the invention, at least two of the junction layers are electrically connected in parallel.

In accordance with another aspect of the invention, at least two of the junction layers are electrically connected in series.

In accordance with another aspect of the invention, at least one of the junction layers is produced from photovoltaic cells based on CIGS alloys.

In accordance with another aspect of the invention, n at least one of the junction layers is produced from photovoltaic cells based on CdTe alloys.

In accordance with another aspect of the invention, at least one of the junction layers is produced from photovoltaic cells based on Si alloys.

In accordance with another aspect of the invention, electrical leads are connected to the electrical terminals.

In accordance with another aspect of the invention, a junction box is provided with connectors connected to the electrical leads.

In accordance with another aspect of the invention, high current protection diodes are provided.

In accordance with another aspect of the invention, the photovoltaic cells in each junction layer are electrically connected to one another in series.

In accordance with another aspect of the invention, a method of producing a multi-junction layer photovoltaic device includes forming a first junction layer by producing a first set of individual photovoltaic cells on a substrate and electrically interconnecting them to one another. A second junction layer is formed by producing a second set of individual photovoltaic cells and electrically interconnecting the photovoltaic cells in the second set to one another. The first junction layer is attached to the second junction layer.

In accordance with another aspect of the invention, the second junction layer is formed on a second substrate prior to attaching the first junction layer to the second junction layer.

In accordance with another aspect of the invention, an insulation layer is formed between the first and second junction layers.

In accordance with another aspect of the invention, a method of producing a multi-junction layer photovoltaic device includes forming a first junction layer by producing a first set of individual photovoltaic cells on a substrate and electrically interconnecting them to one another. An insulation layer is formed above the first junction layer and a second junction layer is formed above the insulation layer by producing a second set of individual photovoltaic cells and electrically interconnecting the photovoltaic cells in the second set to one another.

DETAILED DESCRIPTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

As summarized above and described in more detail below, the apparatus for efficient photovoltaic energy conversion device and the method for producing the same is provided. Embodiments of this apparatus and method may facilitate the ability to efficiently and economically convert electro-magnetic energy in the form of light into electrical energy in the form of electrical current. Embodiments of this apparatus and method may also facilitate large volume production and widespread usage of photovoltaic devices.

This invention provides thin-film technology as an alternative means of producing a multi-junction photovoltaic device. As well known in the art, multi-junction devices in general are more efficient for conversion solar energy into electricity than regular PV devices. However, the development of these devices is currently hindered by the complexity of semiconductor manufacturing processes and their high cost. On the other hand, thin-film processing is substantially less complex and expensive. Using new design approaches and thin-film technology, a new efficient photovoltaic device with expanded capabilities and application range can be produced.

Typically, single-crystal semiconductors are grown epitaxially, layer-by-layer on a monolithic wafer. Thin-film materials, in contrast, depending on their chemical origin can be deposited and layered by a variety of different methods, using for example evaporation, sputtering, spraying, inkjet printing etc., some of which could be very inexpensive. Furthermore, some thin-film layers can be produced separately and then integrated hybridly using bonding, lamination and other similar methods. Alternatively, in some cases the entire structure may be sequentially grown without the need for any mechanical integration of the individual layers. This flexibility in a manufacturing method makes it possible to implement new design approaches in producing a better photovoltaic device.

Figure 1:
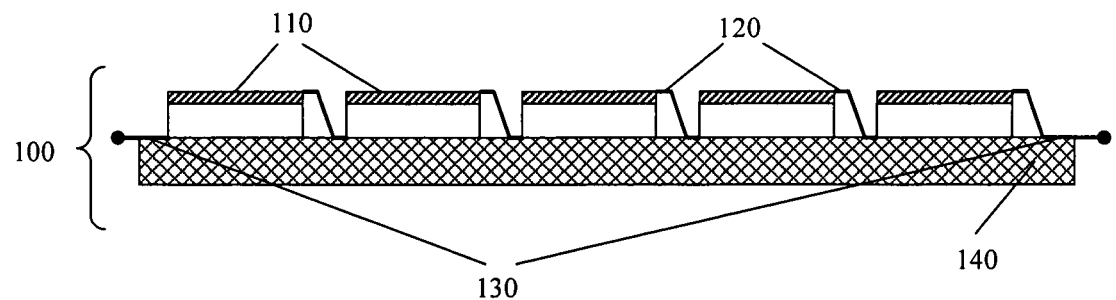
FIG. 1 is a typical PV module.
Figure 2:
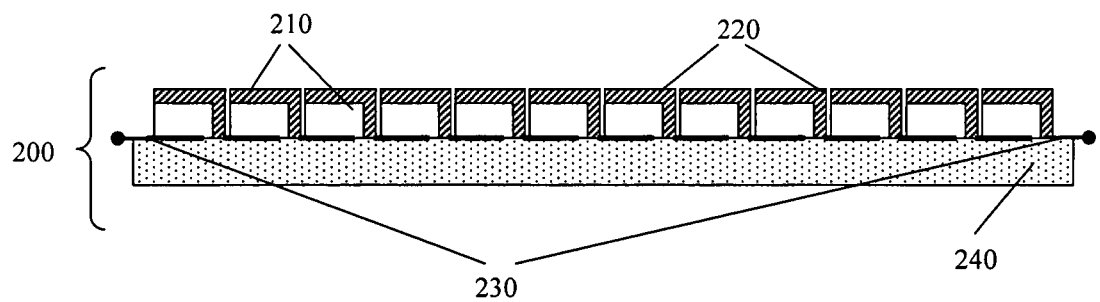
FIG. 2 is a typical monolithically integrated PV module.

A typical photovoltaic (PV) module 100 shown in FIG. 1 includes several PV cells 110, which are interconnected electrically in series by tabs 120. As a result, all photovoltaic power may be extracted at a single a pair of terminals 130. Module 100 may also include a carrier 140 to provide mechanical support for PV cells 110. In this approach cells 110 are produced separately and then manually interconnected with each other to produce a so-called string of cells. Crystalline silicon PV modules, for example, are usually produced using this approach. Alternatively, a monolithically integrated module 200 may be produced as shown in FIG. 2, in which individual cells 210 are produced simultaneously on the same substrate 240 and interconnected using thin-film layers 220 to form a string of cells with a single pair of terminals 230. This manufacturing approach may be used in fabrication of CdTe-based PV modules, for example. In both cases, however, individual cells 110 and 210, respectively, are single-junction cells. Such cells are less efficient in comparison with multi-junction cells.

Figure 3:
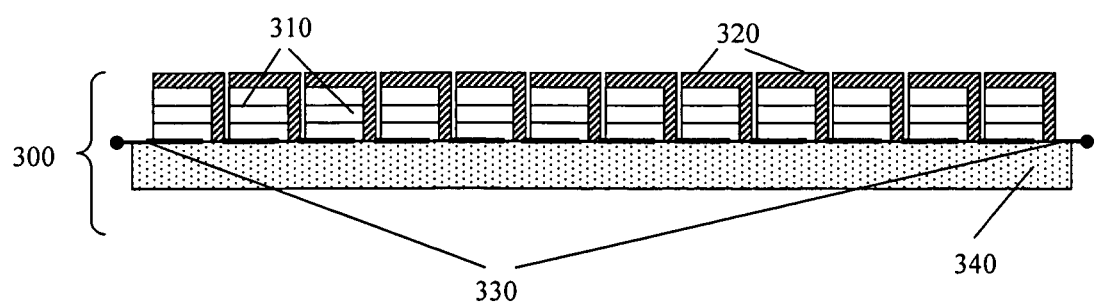
FIG. 3 is a typical monolithically integrated multi-junction PV module.
Figure 4:
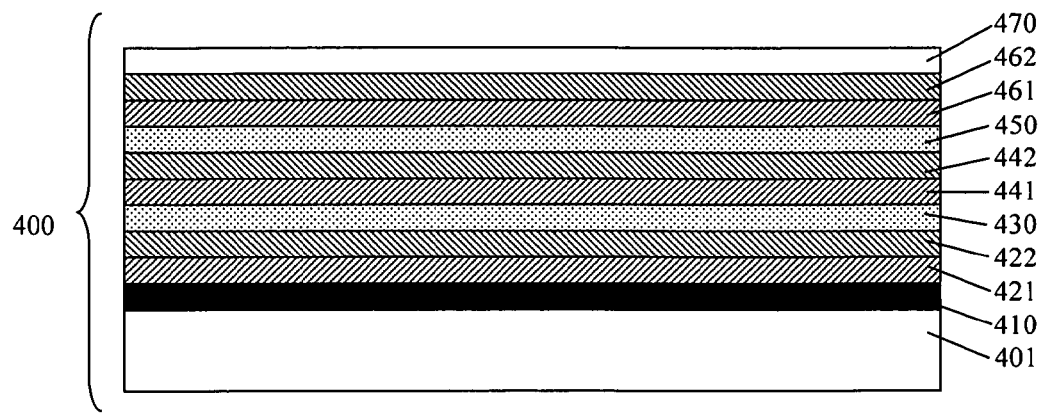
FIG. 4 is a typical multi-junction PV cell.

Strings and modules based on multi-junction cells have also been produced using similar approaches. FIG. 3 shows a PV module 300, where instead of single junction cells, multi-junction cells 310 are monolithically integrated using thin-film interconnections 320 to produce a string of cells 310 with a single pair of terminals 330. The cells 310 are formed on substrate 340. This approach is used, for example, by United Solar to produce modules with triple-junction a-Si cells. In this case, a triple-junction cell 400, which is shown in FIG. 4, includes substrate 401, back contact 410, first p-type semiconductor layer 421, first n-type semiconductor layer 422, buffer layer 430, second p-type semiconductor layer 441, second n-type semiconductor layer 442, buffer layer 450, third p-type semiconductor layer 461, third n-type semiconductor layer 462 and top contact 470. First, second and third junctions are produced between respective p-type and n-type semiconductor layers based on a-Si. The buffer layers provide mechanical and electrical connection between the junctions so that they are connected in series and thus the same electrical current flows through each layer in cell 400. This condition, called current matching, limits the performance of a multi-junction cell and reduces its power conversion efficiency.

Figure 5:
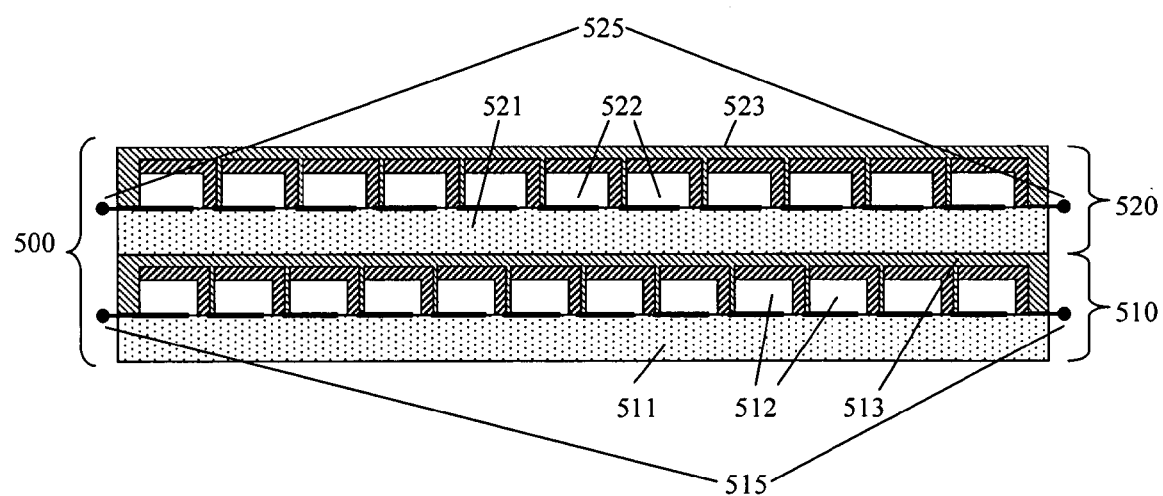
FIG. 5 is a two-junction-layer PV module.
Figure 6:
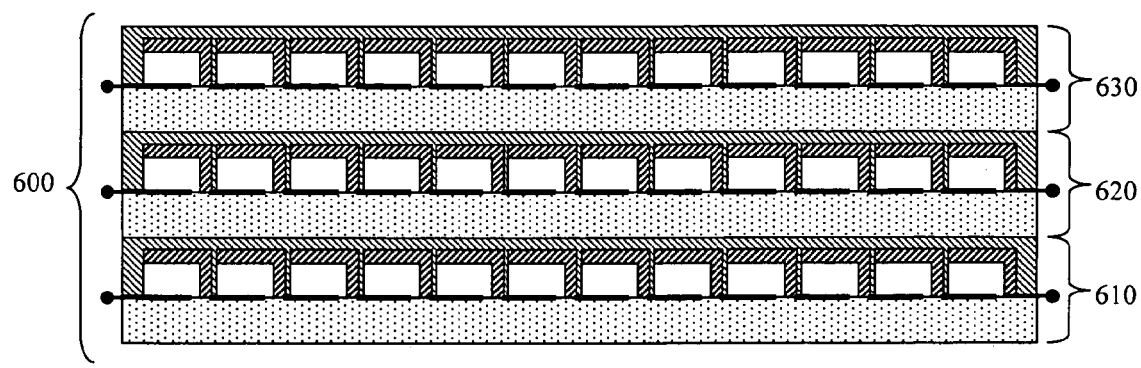
FIG. 6 is a three-junction-layer PV module.

As shown in FIG. 5, the present invention provides a different method of producing a multi-junction PV module. PV module 500 is produced by stacking and attaching at least two junction layers 510 and 520. In this particular example both junction layers 510 and 520 are strings comprised of PV cells electrically connected in series. Individual cells 512 in PV string 510 and cells 522 in PV string 520 may be interconnected using monolithic integration as shown in FIG. 5. Alternatively, other interconnection methods may be used as well, including tabbing or tiling of individual cells. The PV strings may be produced independently from each other on individual substrates 511 and 521, respectively. Strings 510 and 520 may also have individual terminals 515 and 525 for electrical connections. These terminals may be used either for internal or external connections, as discussed below. Protective coatings 513 and 514 may be used to cover PV strings cells 512 and 522, respectively, to improve device reliability and provide mechanical connection. Additional junction layers may be produced using this method, increasing the total number of junction layers to more than two. For instance, FIG. 6 shows a three-junction PV module composed of three individual strings 610, 620 and 630.

Figure 22:
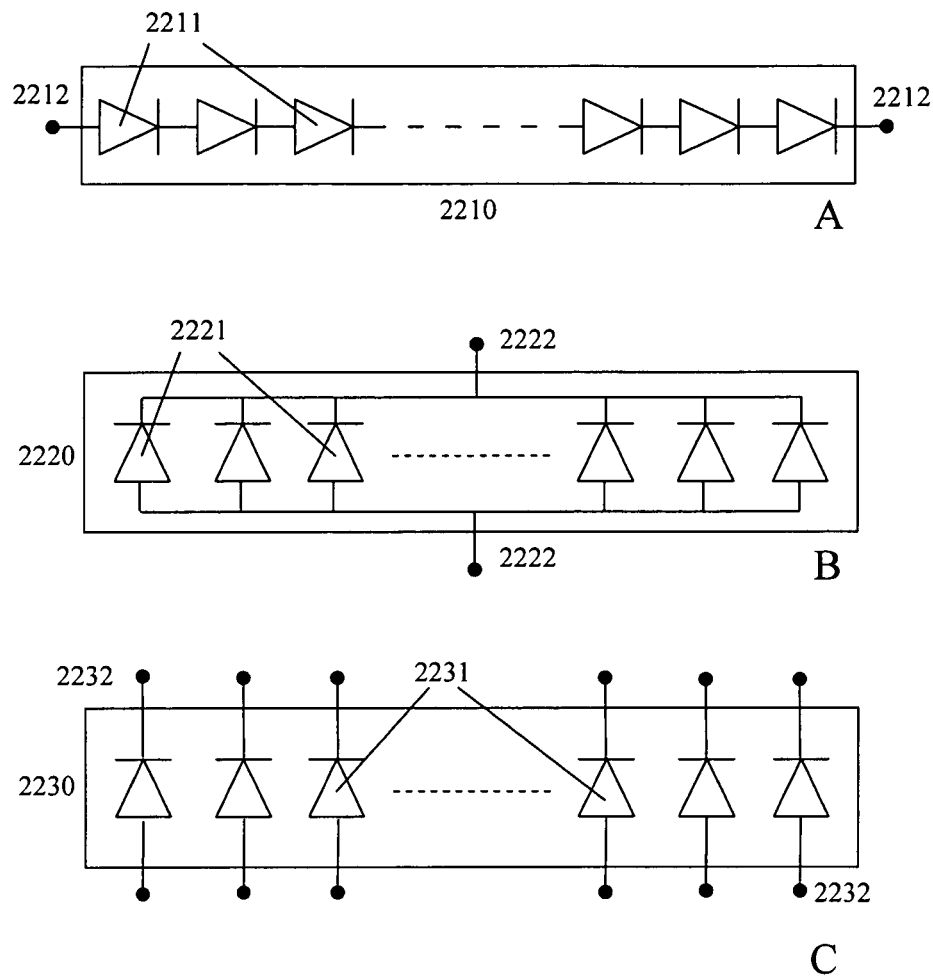
FIG. 22 shows junction layers that are respectively composed of cells electrically interconnected in series (A), in parallel (B) and independently connected (C).

While the example in FIG. 5 shows a pair of junction layers that are formed from strings of cells, the concept of a junction layer may be generalized, as will be explained with reference to FIGS. 22a-22(c). In general, a junction layer may include a plurality of individual PV cells that are electrically connected to one another in any of a variety of different ways. For instance, in FIG. 22(a) junction layer 2210 may include cells 2211 connected in series and a single pair of output terminals 2212. In FIG. 22(b), on the other hand, junction layer 2220 may include cells 2221 connected in parallel and a single pair of output terminals 2222. In FIG. 22(c) junction layer 2230 may include cells 2231 independently connected to a plurality of individual output terminals 2232.

As previously noted, in one aspect of the invention, a junction layer in a multi-junction PV module may be composed of a number of PV cells that are interconnected together to form a PV string. The individual PV cells may be single- or multi-junction cells. In the latter case, a multi-junction PV cell may be a typical multi-junction cell, in which junctions are physically and electrically connected in series (e.g. PV cell 400). Two or more such strings may be stacked on top of each other to produce a multi-junction PV module (e.g. module 500). The upper junction layers, or strings, (e.g. string 520) may be at least partially transparent. The numbers of cells in each string (e.g. 510 and 520) may be the same or different. Furthermore, PV cells in different strings (e.g., cells 512 and 522) may be produced using absorber materials with different characteristic bandgaps. In this case the cells in the upper string (string 520) may have a larger bandgap absorber as compared to that of the cells in the lower string (string 510). In this case the cells in the upper string, i.e. the upper junction layer, face the light source, absorb the first portion of the light and transmit the rest to the bottom cells.

In yet another aspect of the invention, a multi-junction PV module is produced in which each junction layer contains multiple PV cells directly connected with each other in series and forming at least one PV string. There may be at least two junction layers, and the upper junction layers may be at least partially transparent. It may be preferred to produce PV cells in different junction layers from different absorber materials, so that the absorber bandgap of a cell in the upper junction layer may be larger than the bandgap of the lower junction layer or layers. There also may be a preferred set of absorber bandgaps for the junction layers that maximizes the power conversion efficiency of a multi-junction PV module.

Figure 7:
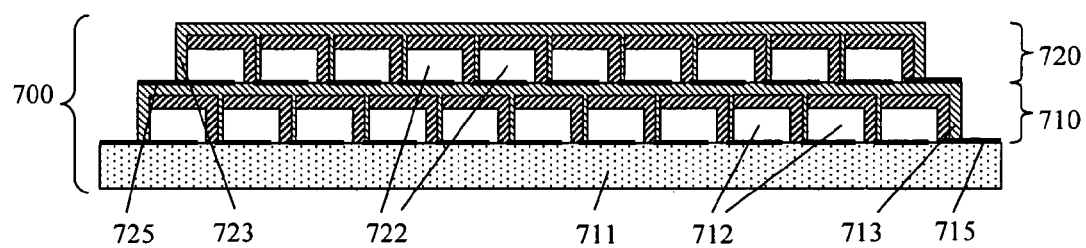
FIG. 7 is a monolithically integrated two-junction-layer PV module.

The junction layers may be produced separately on separate substrates or monolithically on the same substrate. In the latter case, as shown in FIG. 7, the cells in each junction layer may be interconnected monolithically into a string. Common substrate 711 is used to first grow a series of cells 712 interconnected to produce string 710 and then grow a series of cells 722 interconnected to produce string 720. Additional insulating and protective layers 713 and 723 may be grown on top of strings 710 and 720, respectively. Respective electrical contacts 715 and 725 may be produced at the edges. For instance multi-junction PV module based on a-Si and SiGe alloys may be produced using this method. Also, in addition to thin-film deposition techniques other techniques may be used, such as epitaxial growth of III-V type semiconductors, for example.

Figure 9:
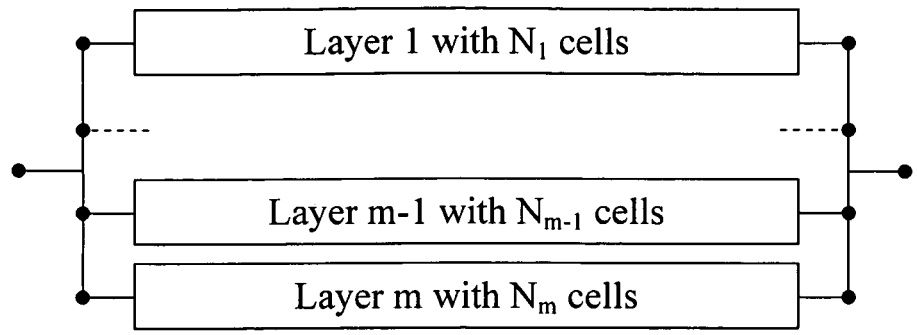
FIG. 9 is a schematic of m-junction-layer PV module with parallel interconnections.
Figure 10:
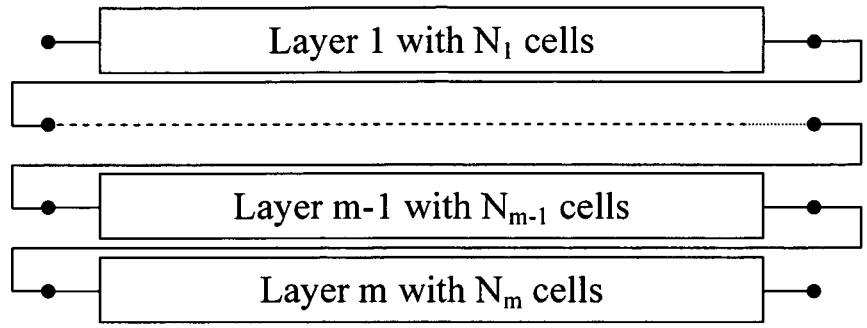
FIG. 10 is a schematic of m-junction-layer PV module with serial interconnections.
Figure 11:
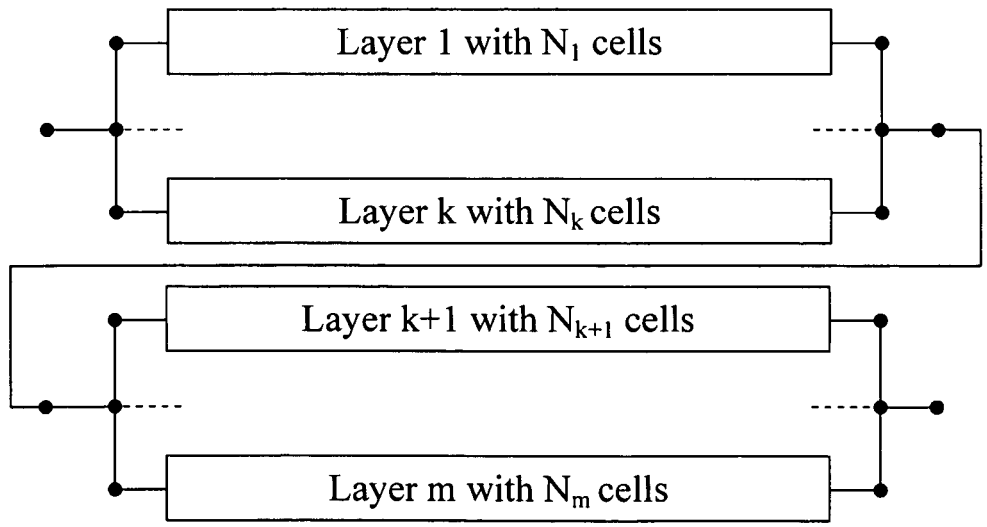
FIG. 11 is a schematic of m-junction-layer PV module with parallel and serial interconnections.

In another aspect of the invention, the characteristics of each junction layer in a multi-junction PV module may be designed and produced in such a way so as to match them and enable electrical interconnection without the use of other electrical conversion circuits. FIG. 9 shows a parallel interconnection of junction layers in an m-junction layer PV module. In this case, the number of cells in each junction layer may be selected so that each layer produces about the same output voltage. Alternatively, FIG. 10 shows an in-series interconnection of junction layers in an m-junction layer PV module. In this case, the number of cells in each junction layer may be selected so that each layer produces about the same output current. FIG. 11 shows a hybrid interconnection of junction layers, in which both types of connections (in parallel and in series) may be used.

Figure 12:
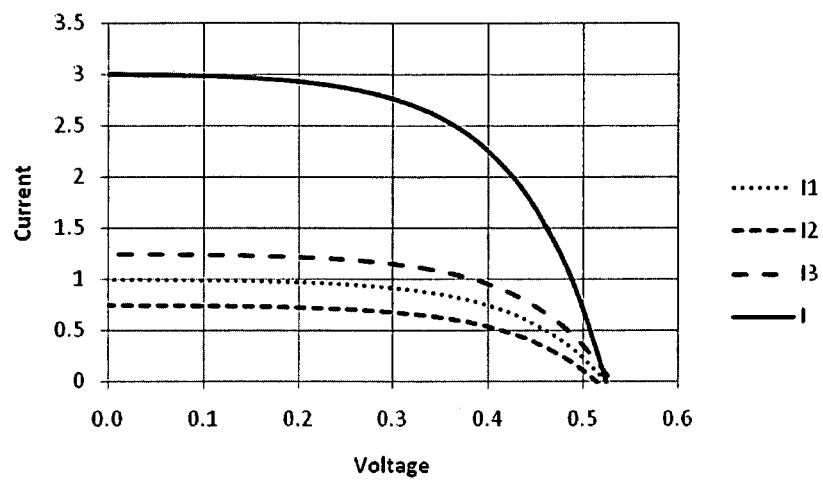
FIG. 12 is a plot of current vs. voltage for three junction layers (I1, I2 and I3) and their total current (I) in a three-junction PV module, where junction layers have been voltage-matched.
Figure 13:
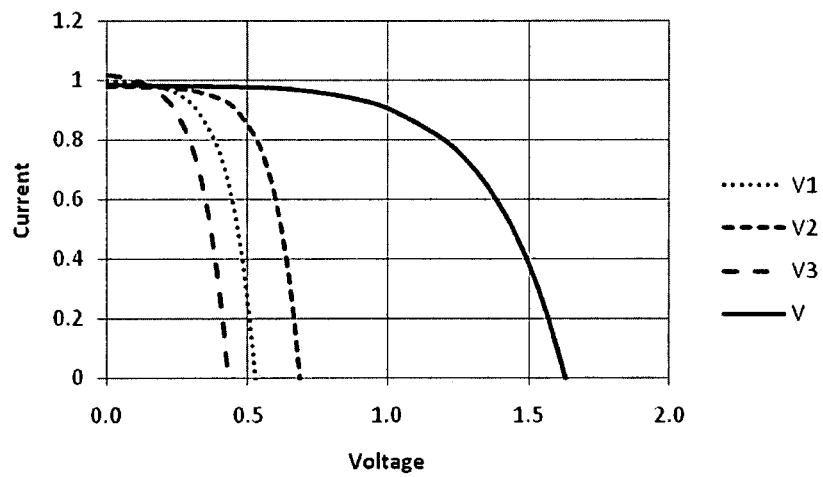
FIG. 13 is a plot of current vs. voltage for three junction layers (V1, V2 and V3) and their total current (V) in a three-junction PV module, where junction layers have been current-matched.

For example, in module 600 shown in FIG. 6, junction layers 610, 620 and 630 may be produced having different current-voltage (IV) characteristics with corresponding sets of open circuit voltage ($V_{oc}$), short circuit current ($I_{sc}$) and maximum power voltage ($V_m$) and current ($I_m$) under typical illumination conditions. I-V characteristics may be matched so that each junction layer produces nearly the same output voltage (voltage matching: $V_1=V_2=V_3$, as shown in FIG. 12) or nearly the same output currents (current matching: $I_1=I_2=I_3$, as shown in FIG. 13). In this case junction layers 610, 620 and 630 may be interconnected either in parallel (for voltage-matched junction layers) or in series (for current-matched junction layers) using corresponding electrical output terminals. Other interconnection schemes between three junction layers may be used. For example, junction layers 610 and 620 may be current matched and interconnected in series. Junction layer 630 in turn may be voltage matched and connected in parallel to the in-series interconnected layers 610 and 620. Electrical interconnections may be achieved using either internal connections inside a PV module or external connectors accessible from the outside of a PV module.

The devices, apparatus and methods described herein provide technical benefits and advantages that are currently not achieved with conventional technologies. For example, new module designs may be produced in which a multi-junction PV module is subdivided into multiple junction layers with independent output terminals. Alternatively, a new design may be produced in which some cells and junction layers may be connected in series with better current matching characteristics and therefore higher conversion efficiency than standard designs. This advantage may be realized because the current matching condition in this case is established between whole junction layers rather than individual cells. Also, parallel interconnections become possible in this new design approach, since such interconnections occur between junction layers rather than individual cells and therefore not only current but also voltage matching conditions can be achieved.

The invention can also greatly facilitate manufacturing of multi-junction modules by, among other things, improving manufacturing yield and enabling new PV technologies. Individual junction layers may be inspected and tested before the final assembly of a multi-junction PV module, thus avoiding the risk of using a nonperforming cell in the assembly Furthermore, different PV technologies may be used and mixed in the manufacturing of such a multi-junction PV module, which may lower manufacturing costs and increase performance.

EXAMPLES

Figure 8:
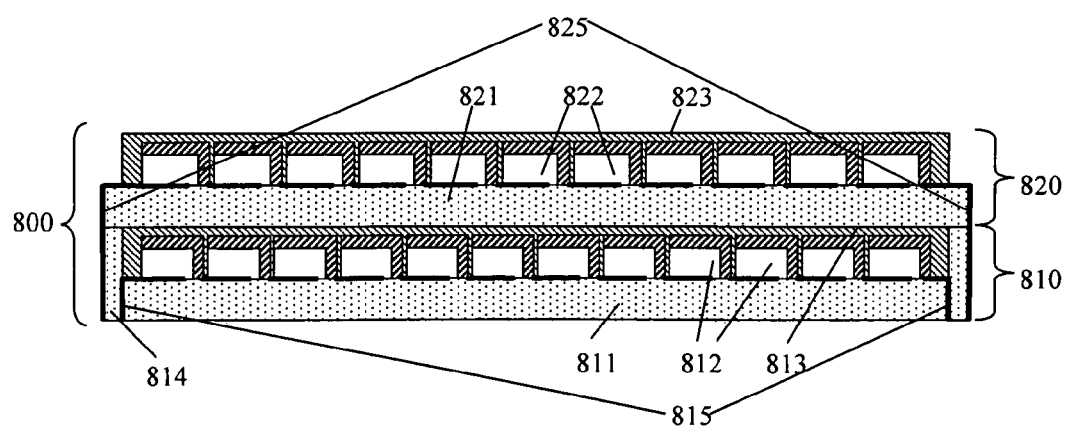
FIG. 8 is a two-junction-layer PV module with external electrical leads.

In one embodiment of this invention, a two junction layer PV module may be produced as shown in FIG. 8. Bottom junction layer 810 may be made of several thin-film cells 812, which are monolithically integrated and connected electrically in series to form a single string. Corresponding thin-film semiconductor absorber material may be based on $CuInSe_2$ compound and its alloys with Ga and S, more commonly known in the industry as CIGS. Similarly, top junction layer 820 may be also made of several CIGS-based cells 822, which are monolithically integrated and connected electrically in series into a single string. It may be preferred to adjust the CIGS compositions of cells 812 and 822 so that their respective optical bandgaps are about 1.1 eV and 1.7 eV. The respective compositions of cells 812 and 822 in this case may be close to $CuIn_{0.8}Ga_{0.2}Se_2$ and $CuGaSe_2$, for instance. Monolithic integration of these CIGS cells may be accomplished by laser and mechanical scribing. The top junction layer (layer 820) may be produced on a transparent substrate 821, such as soda lime glass (SLG) or polyimide. Furthermore, back contacts used in cells 822 may be also transparent, such as for example doped tin oxide or indium tin oxide. The bottom junction layer (layer 810) may be produced on similar substrates or other types of substrates, for example stainless steel or aluminum foil. Junction layers 810 and 820 may be laminated together to produce two junction layer PV module 800. An additional adhesion layer 813, such as a silicone layer, may be used to attach the two layers. Individual contact pairs 815 and 825 may be provided for both junction layers. Additional insulating layers 814 may be used to provide electrical separation between these contacts.

In another embodiment, a three-junction PV module may be produced using three different types of CIGS cells. It may be preferred to have bottom, middle and top junction layers with cells having corresponding CIGS compositions close to $CuInSe_2$, $CuIn_{0.7}Ga_{0.3}S_{0.6}Se_{1.4}$ and $CuIn_{0.3}Ga_{0.7}SeS$, respectively. These compositions in turn produce semiconductors with characteristic bandgaps of about 1 eV, 1.35 eV and 1.8 eV.

In another embodiment, a multi-junction PV module may be produced using junction layers comprising cells based on CIGS alloys with Al, Te or other elements.

In another embodiment, a multi-junction PV module may be produced using junction layers comprising cells based on CdTe alloys, such as $Cd_{1-x}Hg_xTe$, $Cd_{1-x}Mn_xTe$, $Cd_{1-x}Zn_xTe$, $Cd_{1-x}Mg_xTe$, and others.

In another embodiment, a multi-junction PV module may be produced using junction layers comprising cells based on Si, Si:H, Si:C and Si:Ge alloys, either in polycrystalline, micro-crystalline, nanocrystalline or amorphous form.

In another embodiment, a multi-junction PV module may be produced using junction layers comprising dissimilar materials, e.g. CIGS, CdTe, Ge and others.

In another embodiment, a multi-junction PV module may be produced by aligning and joining junction layers, so that the scribing lines are aligned between the adjacent layers (e.g. module 600 in FIG. 6).

Figure 14:
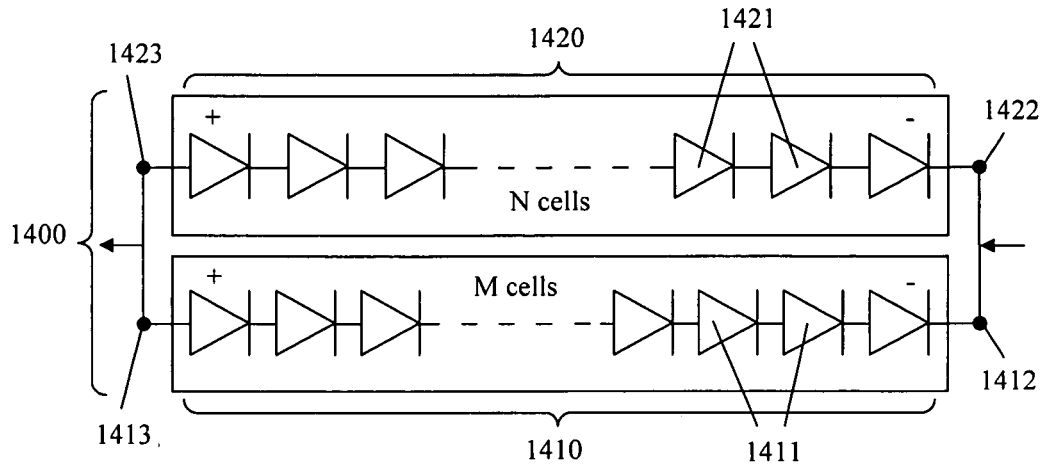
FIG. 14 is a schematic of two-junction-layer PV module with parallel interconnections.

In another embodiment, a two-junction PV module 1400 may be produced as shown in FIG. 14, in which the two junction layers 1410 and 1420 are comprised of cells 1411 and 1421, respectively, having different output voltages, e.g. $V_{top}$ and $V_{bottom}$. The number of cells in the junction layers may be chosen so that the layers' output voltages are about the same, i.e. $V_{out}=NV_{top}=MV_{bottom}$. In this case, the two junction layers may be connected in parallel, i.e. terminal 1412 connects to terminal 1422 and terminal 1413 connects to terminal 1423. Of course, similarly a three-junction or N-junction PV module may be produced, in which at least some junction layers are connected in parallel. In this particular case, the mutual orientations of the junction layers may be the same as shown in FIG. 14 (sides with same polarity face the same way), which is convenient for parallel interconnections.

Figure 15:
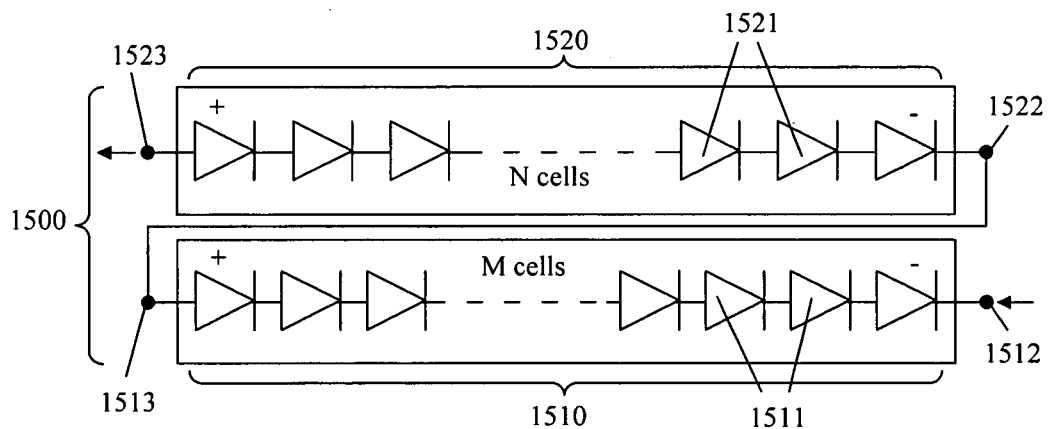
FIG. 15 is a schematic of two-junction-layer PV module with serial interconnections.
Figure 16:
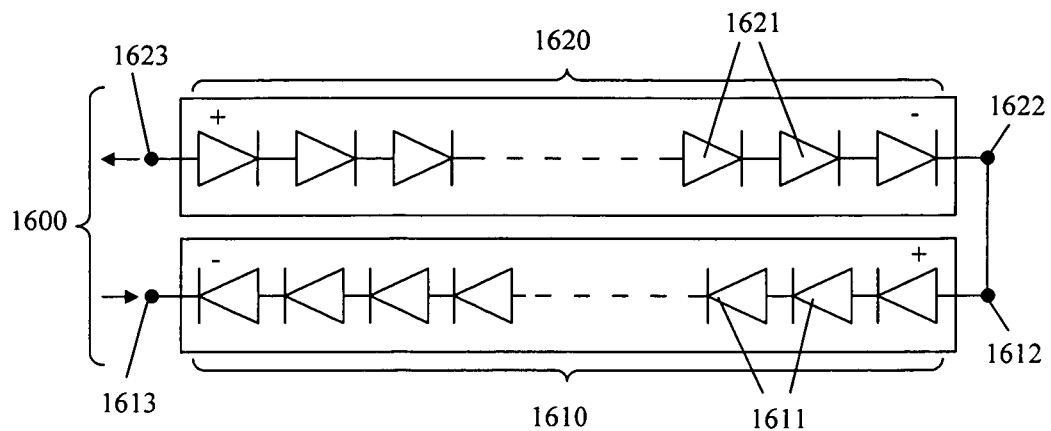
FIG. 16 is a schematic of two-junction-layer PV module with serial interconnections.

In another embodiment, a two-junction PV module 1500 may be produced as shown in FIG. 15, in which the two junction layers 1510 and 1520 are comprised of cells 1511 and 1521, respectively, having different output currents, e.g. $I_{top}$ and $I_{bottom}$. The number of cells in the junction layers may be chosen so that the layer output currents are about the same. In this case, the two junction layers may be connected in series, i.e. terminal 1523 connects to terminal 1522. Of course, similarly a three- or more layered junction PV module may be produced, in which at least some junction layers are connected in series. In this particular case, the mutual orientation of the junction layers may be the same as shown in FIG. 15. Alternatively and more preferably, junction layers may be oriented opposite of each other as shown in FIG. 16, which is more convenient for in-series layer interconnections. In this case, the output polarities of the adjacent junction layers are reversed, so that the positive terminal 1612 of junction layer 1610 is on the same side next to the negative terminal 1622 of junction layer 1620 and visa versa.

Figure 17:
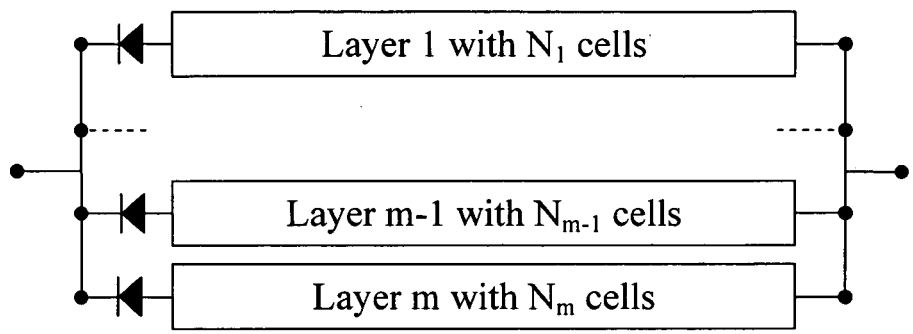
FIG. 17 is a schematic of m-junction-layer PV module with parallel interconnections and high current protection diodes.
Figure 18:
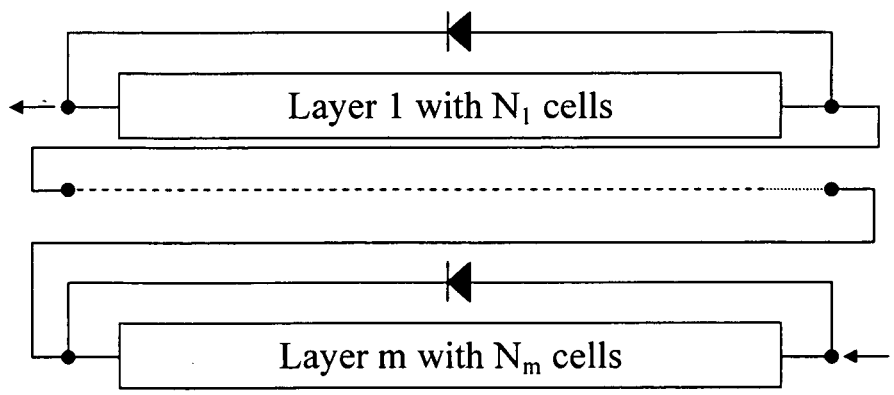
FIG. 18 is a schematic of m-junction-layer PV module with serial interconnections and high current protection diodes.

In another embodiment, a multi-junction PV module may be produced comprised of multiple junction layers, at least some of which include bypass diodes for protection against either reverse current or voltage. For example, FIG. 17 shows an m junction layer PV module, in which the junction layers are connected in parallel and each one of them has a blocking diode connected in series for protection against a high reverse current. Also, FIG. 18 shows an m junction layer PV module, in which the junction layers are connected in series and each one of them has a bypass diode connected in parallel for protection against a high forward current.

Figure 19:
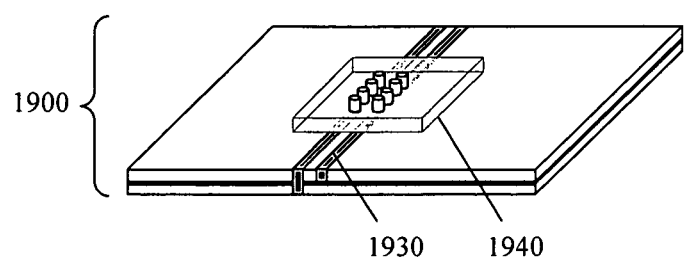
FIG. 19 is the backside of a two-junction layer PV module with external leads and a junction box.

In another embodiment, a two junction layer PV module 1900 may be produced as shown in FIG. 19, in which the terminals from each junction layer are connected to wraparound leads 1930 that in turn connect to respective terminals in a junction box 1940.

Figure 20:
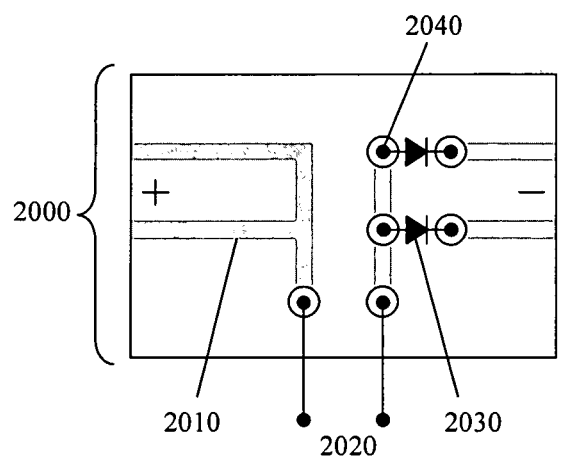
FIG. 20 is a junction box for a two-junction layer PV module with parallel interconnections.

In another embodiment, a two junction layer PV module may comprise two junction layers connected in parallel. The junction interconnection may be external and occur inside the junction box 2000 shown in FIG. 20. In this case the junction box provides easy access to the connections 2020 and other terminals and in particular, terminals 2040 for connecting current-blocking protection diodes 2030. The diodes may be easily replaced if necessary.

Figure 21:
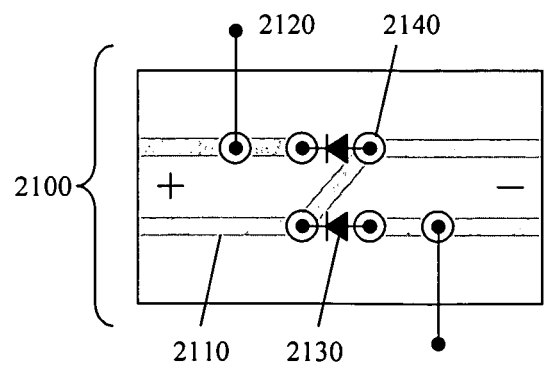
FIG. 21 is a junction box for a two-junction layer PV module with serial interconnections.

In another embodiment, a two junction layer PV module may comprise two junction layers connected in series. The junction interconnection may be external and occur inside the junction box 2100 shown in FIG. 21. Similarly, a multi-junction PV module with more than two junction layers may be provided with a junction box and corresponding connection terminals.

In another embodiment, a multi-junction PV module may be produced using a non-planar substrate, for example cylindrical, spherical, or arbitrarily shaped. Junction layers may be successively attached or laminated onto such a substrate.

Variations of the apparatus and method described above are possible without departing from the scope of the invention.

What is claimed is:

1. A photovoltaic device comprising
   a plurality of junction layers, each of said plurality of junction layers comprising a plurality of photovoltaic cells electrically connected to one another, wherein each of said plurality of junction layers includes its own substrate on which the plurality of photovoltaic cells is disposed;
   at least one of said plurality of junction layers being at least in part optically transmissive; and
   said plurality of junction layers arranged in a stack on top of each other, at least two of said substrates being separated from one another by a junction layer.

2. The photovoltaic device of claim 1 wherein each of said junction layers comprises at least one pair of electrical terminals for receiving photogenerated current.

3. The photovoltaic device of claim 1 wherein said junction layers are manufactured separately on separate substrates.

4. The photovoltaic device of claim 1 wherein said junction layers are laminated to each other.

5. The photovoltaic device of claim 1 wherein said junction layers are produced on a common substrate.

6. The photovoltaic device of claim 1 wherein said junction layers are electrically insulated from each other.

7. The photovoltaic device of claim 1 wherein said plurality of junction layers comprises at least first and second junction layers, the first junction layer being configured to absorb a first portion of incident light energy and transmit a second portion of the incident light energy to the second junction layer, the second junction layer being configured to absorb at least a portion of the second incident light energy.

8. The photovoltaic device of claim 7 wherein said first junction layer comprises photovoltaic cells with a characteristic bandgap that is larger than that of cells in said second junction layer.

9. The photovoltaic device of claim 1 wherein a number of said photovoltaic cells in at least two of the junction layers are chosen so that their respective output voltages are about equal.

10. The photovoltaic device of claim 1 wherein a number of said photovoltaic cells in at least two of the junction layers are chosen so that their respective output currents are about equal.

11. The photovoltaic device of claim 2 wherein at least two of the junction layers are electrically connected in parallel.

12. The photovoltaic device of claim 2 wherein at least two of the junction layers are electrically connected in series.

13. The photovoltaic device of claim 1 wherein the photovoltaic cells in at least one of the junction layers is based on CIGS alloys.

14. The photovoltaic device of claim 1 wherein the photovoltaic cells in at least one of the junction layers is based on CdTe alloys.

15. The photovoltaic device of claim 2 further comprising electrical leads connected to said electrical terminals.

16. The photovoltaic device of claim 1 wherein the photovoltaic cells in each junction layer are electrically connected to one another in series.

\* \* \* \* \*